(12) United States Patent
Wong et al.

(10) Patent No.: US 6,243,280 B1
(45) Date of Patent: Jun. 5, 2001

(54) SELECTIVE MATCH LINE PRE-CHARGING IN A PARTITIONED CONTENT ADDRESSABLE MEMORY ARRAY

(75) Inventors: Hok F. Wong, Sunnyvale; Jose Pio Pereira, Santa Clara; Varadarajan Srinivasan, Los Altos Hills, all of CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 09/391,989

(22) Filed: Sep. 9, 1999

(51) Int. Cl.$^7$ .................................................. G11C 15/00
(52) U.S. Cl. ...................... 365/49; 365/203; 365/230.03
(58) Field of Search ........................ 365/49, 203, 230.03

(56) References Cited

U.S. PATENT DOCUMENTS

| | | | |
|---|---|---|---|
| 5,483,480 | 1/1996 | Yoneda .................................. | 365/49 |
| 5,517,441 | 5/1996 | Dietz et al. ............................ | 365/49 |
| 5,659,697 | * 8/1997 | Dietz ..................................... | 365/49 |
| 5,978,246 | 11/1999 | Shindo ................................... | 365/49 |

* cited by examiner

*Primary Examiner*—Vu A. Le
(74) *Attorney, Agent, or Firm*—William L. Paradice III (57) ABSTRACT

Rows of a CAM array are partitioned into a plurality of row segments, with each row segment having a corresponding match line segment. A first match line segment is pre-charged to enable detection of match conditions in the associated first row segment. Subsequent match line segments are then selectively charged in response to the match conditions in the preceding row segments. In one embodiment, rows of a CAM array are partitioned into first and second row segments. A first match line segment is pre-charged to enable detection of match conditions within the associated first row segment. If there is a match condition in the first row segment, a second match line segment is charged to enable detection of match conditions in the associated second row segment. If there is a match condition in the second row segment, a match condition is indicated for the row. If there is not a match condition in the second row segment, a mismatch condition is indicated for the row. Conversely, if there is not a match condition in the first row segment, the second match line segment is not charged, thereby disabling the second match line segment. In this manner, a mismatch condition may be indicated for the row without pre-charging the second match line segment.

40 Claims, 7 Drawing Sheets

SELECTIVE MATCH LINE PRE-CHARGING IN A PARTITIONED CONTENT ADDRESSABLE MEMORY ARRAY

CROSS-REFERENCE TO RELATED APPLICATION

This application is related to the commonly owned U.S. patent application Ser. No. 09/392,972 entitled "SELECTIVE MATCH LINE DISCHARGING IN A PARTITIONED CONTENT ADDRESSABLE MEMORY ARRAY," filed on the same day as the present application.

BACKGROUND

1. Field of Invention

This invention relates generally to semiconductor memories and specifically to content addressable memories.

2. Description of Related Art

A CAM includes an array of memory cells arranged in a matrix of rows and columns. Each memory cell stores a single bit of digital information, i.e., either logic zero or logic one. The bits stored within a row of memory cells constitute a CAM word. During compare operations, a comparand word is received at appropriate input terminals of the CAM and then compared with all the CAM words. For each CAM word that matches the comparand word, a corresponding match line signal is asserted to indicate a match condition. When there is a match condition, the index or address of the matching CAM word is read from the CAM. Associative information stored in, for instance, an associated RAM, may also be provided.

Figure 1:
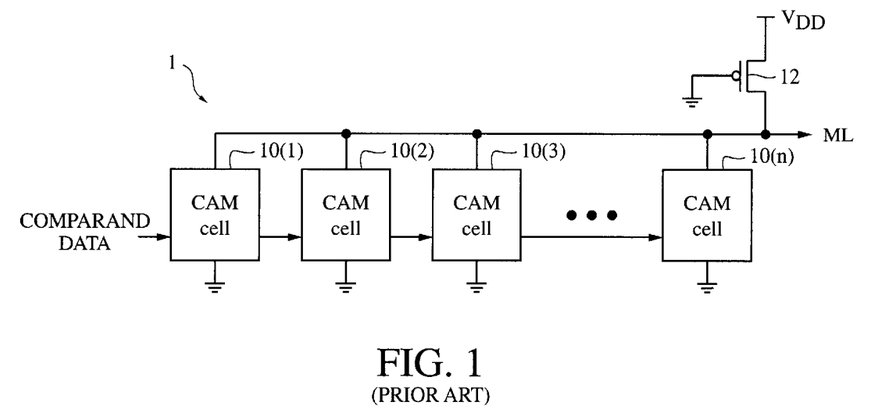
FIG. 1 is a block diagram of a row of a typical CAM array.

FIG. 1 shows a typical CAM row 1 as having n CAM cells 10(1)–10(n) each coupled to an associated match line ML. A pull-up transistor 12, coupled between a supply voltage $V_{DD}$ and match line ML, has a gate tied to ground potential, and therefore remains in a conductive state. Prior to each compare operation between an n-bit comparand word and an n-bit CAM word stored in CAM cells 10(1)–10(n), match line ML is pre-charged to supply voltage VDD via pull-up transistor 12. The n-bits of the comparand word are compared with corresponding bits of the CAM word in respective CAM cells 10(1)–10(n). If all bits of the comparand word match corresponding bits of the CAM word, the match line ML remains charged to indicate a match condition. Conversely, if one of the comparand bits does not match the corresponding CAM bit, the CAM cell 10 storing that CAM bit discharges match line ML toward ground potential to indicate a mismatch condition.

As described above, the match lines in a CAM array are typically pre-charged to the supply voltage VDD for each and every compare operation. Thus, for each mismatch condition, an associated match line ML is first charged toward $V_{DD}$ and then discharged toward ground potential. Current flow associated with this charging and discharging results in undesirable power consumption. Further, as the number of CAM cells in each row of a CAM array increases, capacitive loading on the match lines increases accordingly. As loading on the match lines increases, the current required to charge the match lines toward the supply voltage increases. Accordingly, as CAM words are widened, for example, to accommodate longer Internet addresses, power consumption resulting from charging the match lines during compare operations may significantly increase. Therefore, as CAM words become wider, it is desirable to reduce power consumption during compare operations.

SUMMARY

A method and apparatus are disclosed that may reduce power consumption in a CAM during compare operations. In accordance with one embodiment of the present invention, rows of the CAM array are partitioned into a plurality of row segments, with each row segment having a corresponding match line segment. A first match line segment is pre-charged to enable detection of match conditions in the associated first row segment. Subsequent match line segments are then selectively pre-charged in response to the match conditions in the preceding row segments.

In one embodiment, rows of a CAM array are partitioned into first and second row segments. A first match line segment is pre-charged to enable detection of match conditions within the associated first row segment. If there is a match condition in the first row segment, a second match line segment is pre-charged to enable detection of match conditions in the associated second row segment. If there is also a match condition in the second row segment, a match condition is indicated for the row. A mismatch condition in the second row segment indicates a mismatch condition for the row. Conversely, if there is not a match condition in the first row segment, the second match line segment is not pre-charged, thereby disabling the second match line segment. In this manner, a mismatch condition may be indicated for the row without pre-charging the second match line segment. In this case, where only the first match line segment is pre-charged during the compare operation, power consumption associated with pre-charging the second match line segment is saved. Accordingly, where the first and second row segments include equal numbers of CAM cells, and thus the first and second match line segments are approximately equally loaded by the CAM cells, present embodiments may achieve power savings of up to 50% during such pre-charge operations. Since power savings is proportional to the number CAM cells per row that are enabled during each compare operation, higher power savings may be achieved by increasing the number of row segments, or by having different numbers of CAM cells in each row segment.

BRIEF DESCRIPTION OF THE DRAWINGS

Like reference numerals refer to corresponding parts throughout the drawing figures.

DETAILED DESCRIPTION

Embodiments of the present invention are discussed below in the context of a CAM architecture 20 for simplicity only. It is to be understood that embodiments of the present invention are equally applicable to CAM structures of other sizes and configurations, as well as to other types of memory devices such as, for instance, RAM, Flash, and EEPROM. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Figure 2:
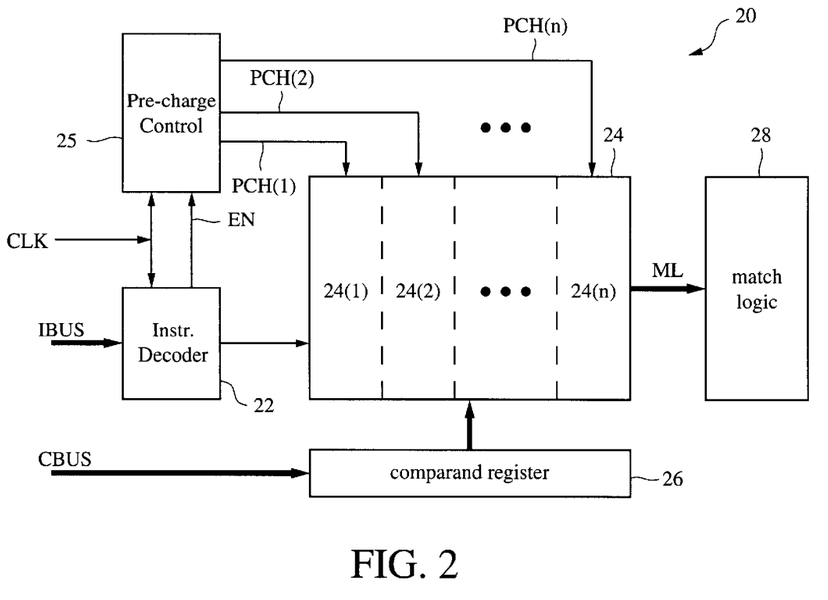
FIG. 2 is a block diagram of a CAM architecture in accordance with one embodiment of the present invention.

FIG. 2 shows a CAM architecture 20 in accordance with the present invention including an instruction decoder 22, a CAM array 24, a comparand register 26, a pre-charge control circuit 25, and match logic 28. Instruction decoder 22 decodes instructions received from an instruction bus IBUS and, in response thereto, provides control signals to CAM array 24 (e.g., write and/or read circuitry not shown). CAM architecture 20 may be a synchronous architecture that loads instructions into instruction decoder 22 in response to a clock signal CLK. For other embodiments, CAM architecture 20 may be asynchronous. A comparand word to be compared with data words stored in corresponding rows of CAM array 24 is received on a comparand bus CBUS and thereafter provided directly to CAM array 24, or provided to CAM array 24 via the comparand register 26. For compare operations, one or more bits of the comparand word may be globally masked by mask data stored in one or more registers (not shown), or locally masked. During compare operations, each row of CAM array 24 provides a match signal to match logic 28 via match lines ML to indicate whether a match condition exists for the row. Match logic 28 may output one or more flag signals including a single match flag, a multiple match flag, and/or a full flag signal. The match lines may also be provided to an encoder such as a priority encoder.

CAM array 24 includes a plurality of CAM cells arranged in rows and columns. In accordance with the present invention, the rows of CAM array 24 are divided into a plurality of row segments 24(1)–24(n), each including any suitable number of CAM cells. In some embodiments, the row segments each include the same number of CAM cells, while in other embodiments the row segments include different numbers of CAM cells. CAM array 24 includes any type of CAM cells, including any type of binary or ternary CAM cells.

Each row segment 24(1)–24(n) includes an associated match line segment to which the CAM cells therein are connected (for simplicity, match line segments are not shown in FIG. 2). Each match line segment may be selectively pre-charged in response to one of pre-charge signals PCH(1)–PCH(n), respectively. The pre-charge signals PCH are generated by pre-charge control circuit 25 when instruction decoder 22 determines that a compare instruction is provided on IBUS (as indicated by the enable signal EN). Pre-charge control circuit 25 may be any clock buffer, a one-shot circuit (with multiple time-delayed outputs), a phase-locked loop (PLL), or delay-locked loop (DLL). The pre-charge signals PCH may be pulses, clocks, or other signals.

During compare operations, a comparand word provided to comparand register 26 is compared with CAM words stored in corresponding rows of CAM array 24. One or more first match line segments of CAM array 24 are pre-charged by one or more of the pre-charge signals PCH toward a supply voltage $V_{DD}$ (or another predetermined voltage level), while all other match line segments remain uncharged (or, alternately, are discharged). If there is a match condition within the one or more first row segments, one or more second match line segments are pre-charged toward VDD by corresponding pre-charge signals PCH to enable detection of match conditions in the one or more second row segments. Sequential pre-charging of subsequent match line segments in response to match conditions in preceding row segments continues until either (1) all row segments indicate match conditions, in which case a match condition exists for the row, or (2) a mismatch condition is detected, in which case subsequent match line segments are not pre-charged and a mismatch condition is indicated for the row. By sequentially pre-charging match line segments of CAM array 24 in response to match conditions in preceding row segments, present embodiments may significantly reduce power consumption associated with pre-charging match lines during compare operations.

Figure 3:
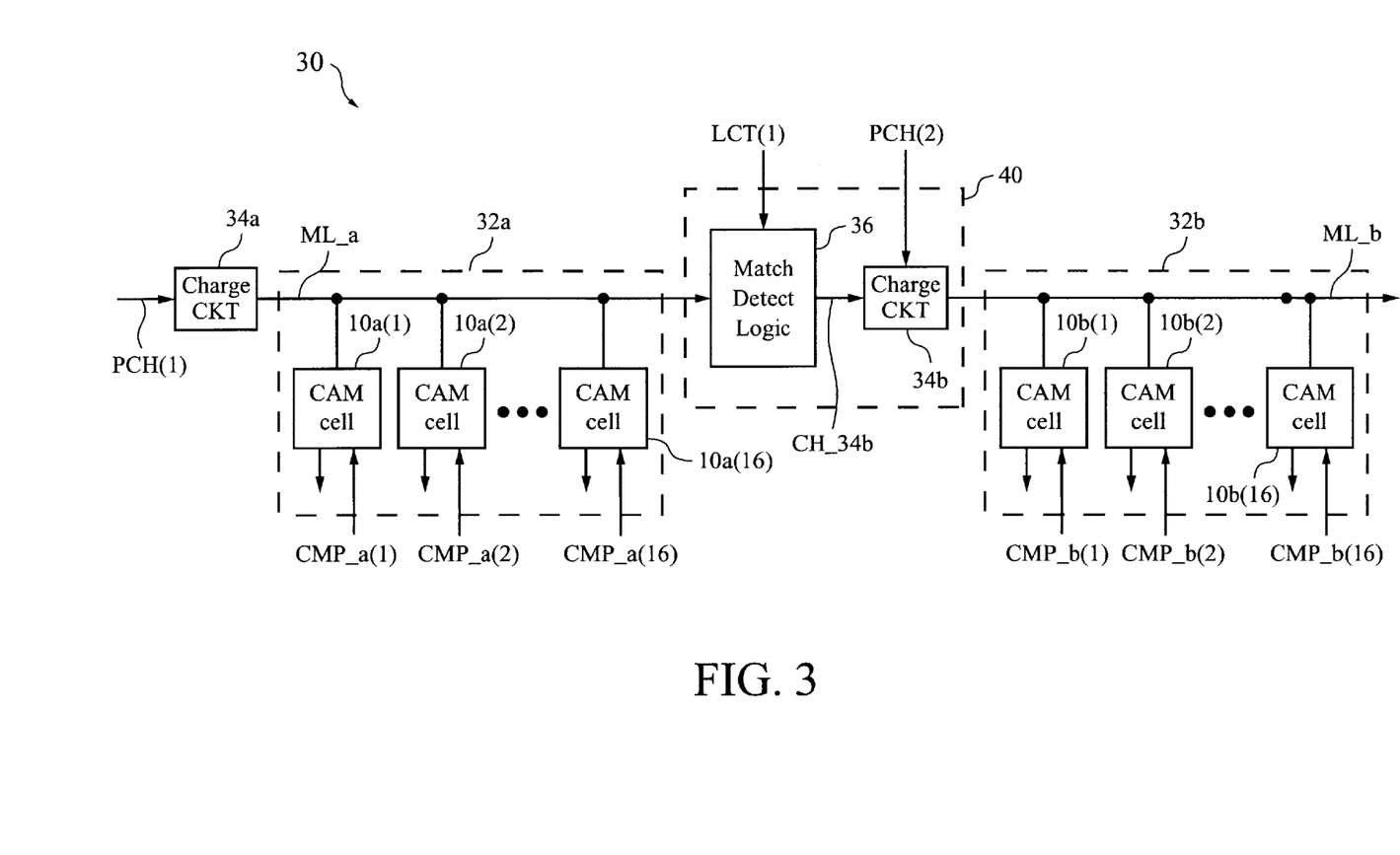
FIG. 3 is a block diagram of a row of the CAM architecture of FIG. 2 in accordance with one embodiment of the present invention.

FIG. 3 shows a 32-bit row 30 in accordance with one embodiment of CAM architecture 20. Row 30 includes two row segments 32a and 32b. Row segment 32a includes sixteen CAM cells 10a(1)–10a(16) each coupled to associated first match line segment ML_a and each receiving one bit of comparand data CMP_a(1)–CMP_a(16), respectively. Second row segment 32b includes sixteen CAM cells 10b(1)–10b(16) each coupled to associated second match line segment ML_b and each receiving one bit of comparand data CMP_b(1)–CMP_b(16), respectively. Word line(s) and bit line(s) have been omitted from FIG. 3 for simplicity. A first charge circuit 34a pre-charges first match line segment ML_a in response to the logic state of pre-charge signal PCH(1). The logic state of first match line segment ML_a, which indicates the match condition of first row segment 32a, is monitored by match detect logic 36. Match detect logic 36 outputs charge signal CH_34b in response to the logic state of first match line segment ML_a and control signal LCT(1). Match detect logic 36 outputs CH_34b to a second charge circuit 34b. Charge circuit 34b pre-charges second match line segment ML_b in response to PCH(2) if CH_34b indicates a match condition for first row segment 32a. Together, match detect logic 36 and charge circuit 34b form a match line control circuit 40 that selectively pre-charges second match line segment ML_b in response to match conditions in first row segment 32a.

In some embodiments, match detect logic 36 includes AND logic that drives CH_34b to logic high in response to ML_a being logic high and LCT(1) being logic high. Charge circuit 34b then pre-charges ML_b when CH_34b is logic high and PCH(2) is asserted. Match detect logic 36 may include one or more other logic gates. In other embodiments, match detect logic 36 includes a well-known latch, and LCT(1) latches the logic state of first match line segment ML_a to generate CH_34b. For still another embodiment, match detect logic 36 may be a voltage level shifter (e.g., a logic gate) that adjusts the voltage level on ML_a to appropriate logic levels for charge circuit 34b. For yet another embodiment, match detect logic 36 may be omitted and ML_a provided to charge circuit 34b as CH_34b.

In one embodiment, logic similar to match detect logic 36 is provided between PCH(1) and first charge circuit 34a, and may also receive an enable signal from instruction decoder 22. In this embodiment, first match line segment ML_a is pre-charged in response to this enable signal and PCH(1). In some embodiments, signal CH_34b may also be provided by instruction decoder 22 to pre-charge all row segments during compare operations, thereby allowing match conditions within all row segments to be evaluated simultaneously.

Figure 4:
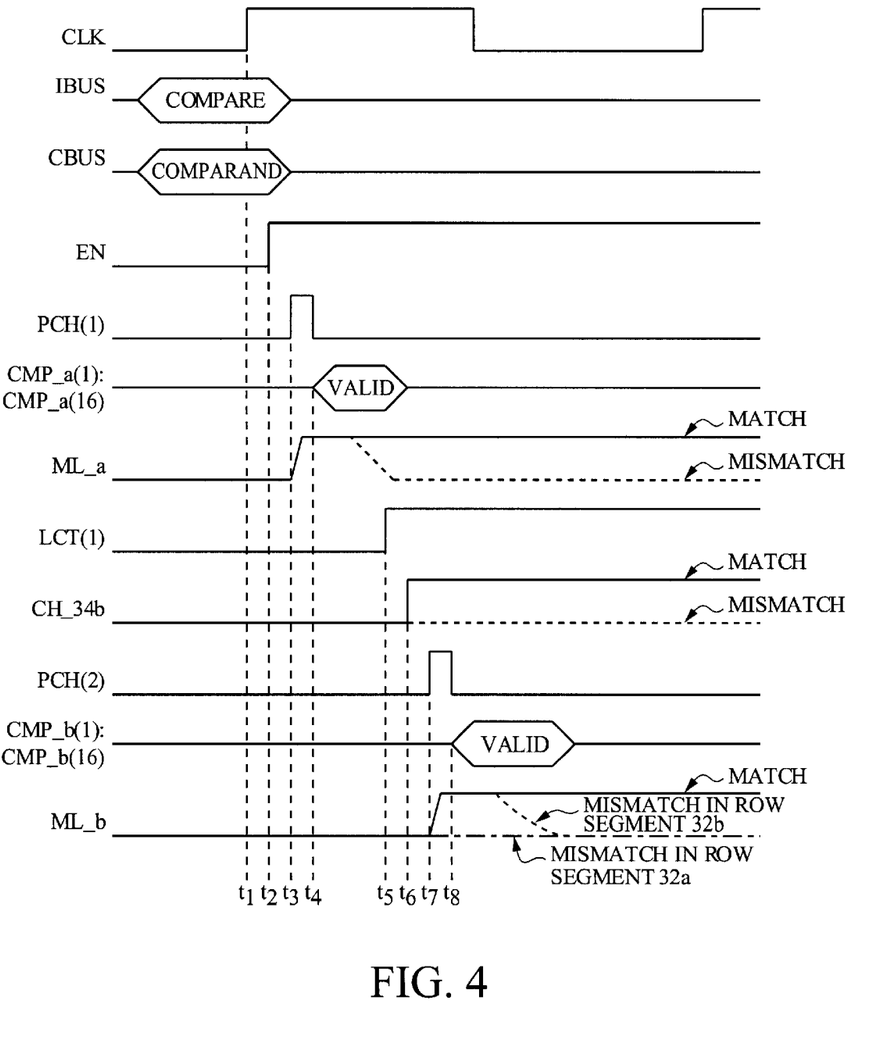
FIG. 4 is a timing diagram illustrating one embodiment of a compare operation of the CAM of FIG. 3.

FIG. 4 shows one example of a timing diagram illustrating a compare operation between a 32-bit comparand word and a 32-bit CAM word stored in row 30. For this embodiment, the pre-charge signals PCH(1) and PCH(2) are pulse signals. At time $t_1$, a compare instruction is provided to and subsequently decoded by instruction decoder 22. In response thereto, instruction decoder 22 asserts EN at time $t_2$, and causes pre-charge control circuit 25 to assert PCH(1) at time $t_3$. PCH(1) causes charge circuit 34a to charge first match line segment ML_a high toward VDD to enable detection of match conditions in first row segment 32a. The comparand bits CMP_a(1)–CMP_a(16) are then compared with data stored in CAM cells 10a(1)–10a(16) within first row segment 32a. CMP_a(1)–CMP_a(16) may be provided at time $t_4$. When there is a match, first match line segment ML_a remains pre-charged to a high logic state. If there is a mismatch, then the CAM cell(s) storing the mismatching data pulls ML_a toward a low logic state.

At time $t_5$, LCT(1) is asserted to latch or determine the logic state of CH_34b. At time $t_6$, PCH(2) is asserted by pre-charge control circuit 25. When ML_a is logic high and match detect logic 36 generates a logic high signal CH_34b, second charge circuit 34b pre-charges second match line segment ML_b toward VDD in response to PCH(2) at time $t_7$. CMP_b(1)–CMP_b(16) are provided to second row segment 32b at time $t_8$. For another embodiment, CMP_b(1)–CMP_b(16) may be provided to the CAM row together with CMP_a(1)–CMP_a(16) at time $t_4$. If all bit comparisons between CMP_b(1)–CMP_b(16) and CAM cells 10b(1)–10b(16) within second row segment 32b match, second match line segment ML_b remains in a logic high state to indicate a match condition for second row segment 32b. Here, there is a match condition for the row. Otherwise, if any of the bit comparisons in the second row segment 32b mismatch, corresponding CAM cell(s) within second row segment 32b pull second match line segment ML_b low toward ground potential to indicate a mismatch condition for the row segment and the row.

On the other hand, if any of the bit comparisons in first row segment 32a mismatch, corresponding CAM cell(s) within first row segment 32a pull first match line segment ML_a low toward ground potential to indicate a mismatch condition. In response to the mismatch condition in first row segment 32a, as indicated by the discharged state of first match line segment ML_a, match detect logic 36 maintains signal CH_34b in a logic low state, as indicated by the dashed line in FIG. 4. In response thereto, second charge circuit 34b does not pre-charge second match line segment ML_b toward $V_{DD}$. Charge circuit 34b may maintain ML_b in a discharged state. Thus, in accordance with the present invention, mismatch conditions in preceding row segment 32a force a mismatch condition for subsequent row segment 32b without pre-charging the subsequent match line segment ML_b. In this case, where only the first match line segment is pre-charged during the compare operation, power consumption associated with pre-charging the second match line segment is saved. Thus, by sequentially pre-charging match line segments in response to match conditions in preceding row segments, present embodiments may reduce power consumption during compare operations.

Power savings realized by present embodiments are proportional to the number of row segments in the CAM array, as well as to the percentage of mismatch conditions in the first row segments. For instance, where each CAM row is partitioned into two segments having equal numbers of CAM cells as shown in FIG. 3, power consumption resulting from the pre-charging of match lines during compare operations may be reduced, for example, by approximately 50%. When employed in applications where compare operations typically result in mismatch conditions, and in particular where the second and all subsequent match line segments are not usually pre-charged, present embodiments may achieve significant power savings.

Figure 5:
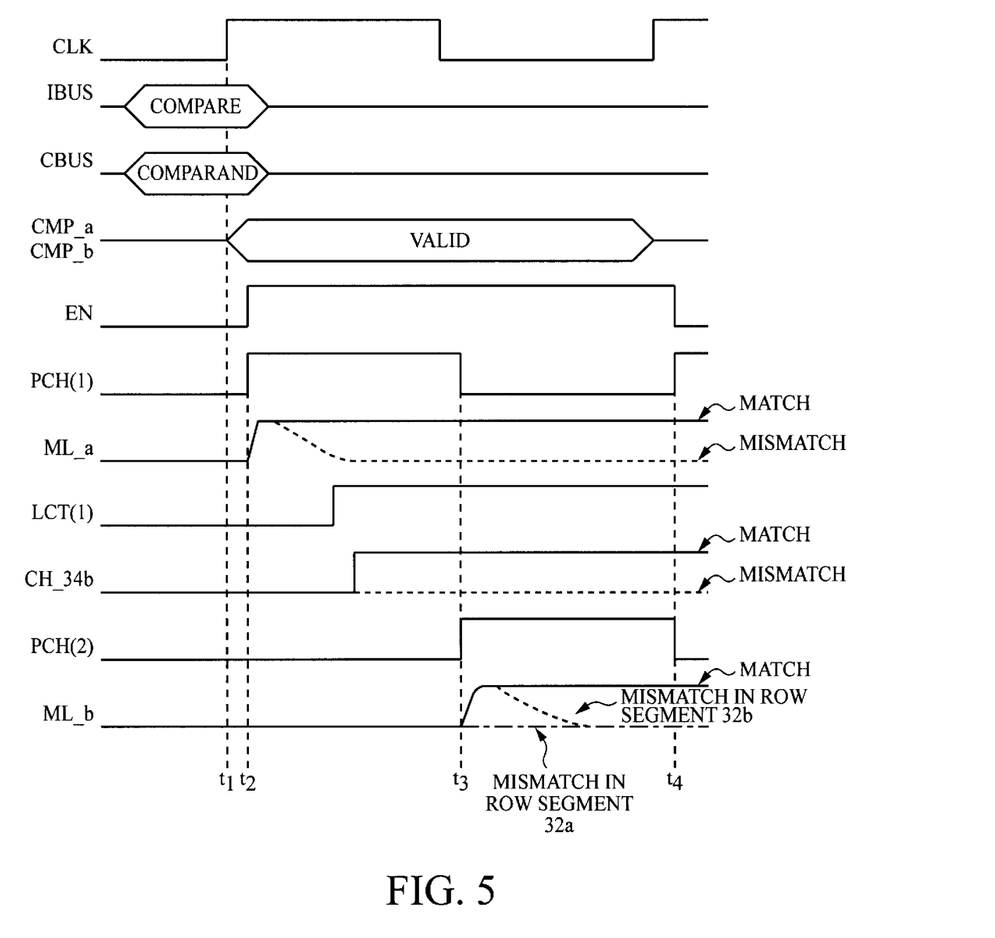
FIG. 5 is a timing diagram illustrating another embodiment of a compare operation of the CAM of FIG. 3.

FIG. 5 shows another example of a timing diagram illustrating a compare operation for row 30. For this embodiment, pre-charge signals PCH(1)–PCH(n) are periodic or clock signals, and the comparand data is provided to row 30 throughout performance of the compare operation. This embodiment may alternately have comparand data CMP_a(1)–CMP_a(16) provided at a different time from CMP_b(1)–CMP_b(16) in FIG. 4. The compare operation of FIG. 5 operates in the same fashion as that of FIG. 4, except that PCH(1) and PCH(2) are clock signals. PCH(1) is asserted at time $t_2$, and oscillates at approximately the same frequency as CLK. PCH(2) is subsequently asserted at time $t_3$, and is thereafter approximately 180° out of phase with PCH(1) for the duration of the instruction. If a third row segment is included in row 30, then it would receive PCH(3) which would be asserted at time $t_4$ and thereafter be approximately 180° out of phase with respect to PCH(2). The periodic pre-charge signals can alternately have any phase relationship with each other so long as each signal is not initially asserted until the preceding row segment has resolved the state of its corresponding match line segment.

Figure 6:
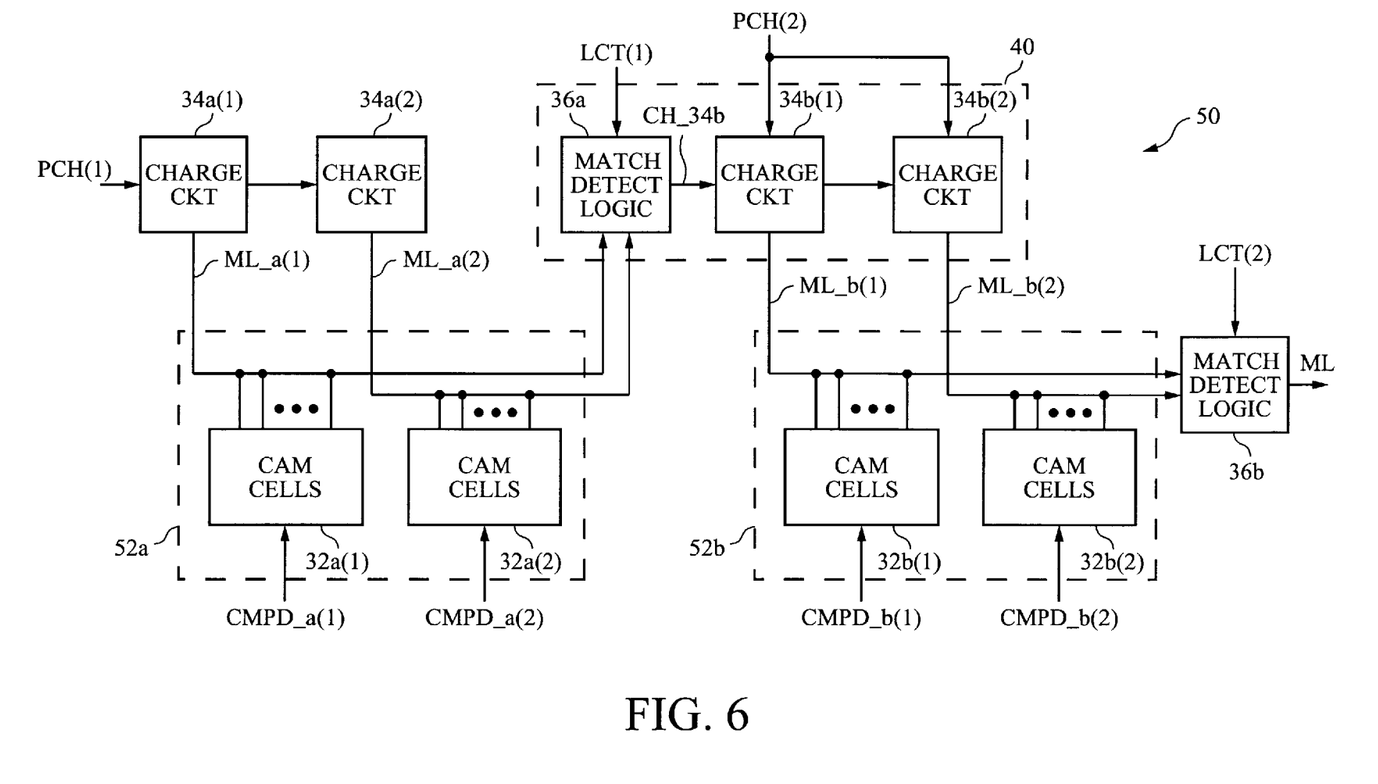
FIG. 6 is a block diagram of one embodiment of a row of the CAM architecture of FIG. 2.

FIG. 6 shows a row 50 in accordance with another embodiment of CAM architecture 20. Row 50 includes two composite row segments 52a and 52b each including two (or more) of the 16-bit row segments 32 of FIG. 3. First composite row segment 52a includes 16-bit row segments 32a(1) and 32a(2), and second composite row segment 52b includes 16-bit row segments 32b(1) and 32b(2). Row segments 32a(1), 32a(2), 32b(1), and 32b(2) are coupled to associated match line segments ML_a(1), ML_a(2), ML_b(1), and ML_b(2), respectively. Charge circuits 34a(1) and 34a(2) charge match line segments ML_a(1) and ML_a(2) of first and second row segments 32a(1) and 32a(2), respectively, high toward $V_{DD}$ in response to PCH(1) to enable detection of match conditions within first composite row segment 52a. Match conditions within row segments 32a(1) and 32a(2) of first composite row segment 52a are provided to match detect logic 36a via match line segments ML_a(1) and ML_a(2), respectively. Match detect logic 36a logically combines the logic states of match line segments ML_a(1) and ML_a(2) to generate CH_34b for charge circuits 34b(1) and 34b(2). For one embodiment, match detect logic 36a is an AND or NAND gate. Logic 36a may also include a latch that latches the logical combination of the match line segments ML_a(1) and ML_a(2) in response to LCT(1).

If there are match conditions within both row segments 32a(1) and 32a(2) of first composite row segment 52a, match detect logic 36a asserts CH_34b such that charge circuits 34b(1) and 34b(2) pre-charge match line segments ML_b(1) and ML_b(2), respectively, when PCH(2) is asserted. Match conditions within row segments 32b(1) and 32b(2) of second composite row segment 52b are then provided to match detect logic 36b via match line segments ML_b(1) and ML_b(2), respectively. In response thereto, match detect logic 36b logically combines the logic states of the match line segments ML_b(1) and ML_b(2) to provide a match signal for row 50 on match line ML. Thus, if there are match conditions in segments 32b(1) and 32b(2) of second composite row segment 52b, match detect logic 36b drives the match line ML high to indicate a match condition for row 50.

If there is a mismatch condition within either of composite row segments 52a or 52b, match detect logic 36b forces match line ML low to indicate a mismatch condition for the row. For example, if first composite row segment 52a has a mismatch, CH_34b is not asserted and charge circuits 34b(1) and 34b(2) discharge match line segments ML_b(1) and ML_b(2), respectively. Also, if a mismatch condition is detected in second composite row segment 52b, one or both of match line segments ML_b(1) and/or ML_b(2) is discharged. When either ML_b(1) or ML_b(2) is discharged, match detect logic 36b does not assert ML.

Any number of composite row segments may be used, with each having a corresponding match control circuit 40. If at any point in the sequential evaluation of match conditions in successive row segments there is a mismatch condition, the corresponding match line segment is discharged toward ground potential and, in response thereto, all subsequent match line segments remain uncharged (e.g., are discharged toward ground potential). In this manner, the mismatch condition propagates through subsequent row segments without enabling subsequent match line segments. Thus, if a mismatch condition is detected in the first of the four row segments, only one of the four corresponding match line segments for each row is pre-charged toward $V_{DD}$, Since the next match line segments are not charged, power consumption associated with charging those match line segments is saved. For example, power consumption associated with match line pre-charging during a compare operation may be reduced by approximately 75% when a mismatch condition is detected in the first composite row segment of a row having 4 total composite row segments. In a similar manner, for compare operations which result in detection of a mismatch condition in the second of the four row segments, the reduction in power consumption during the compare operation may be approximately 50%. Further, for compare operations which result in detection of a mismatch condition in the third of the four row segments, the reduction in power consumption during the compare operation may be approximately 25%.

Present embodiments may also be effective in applications where the external data bus width is narrower than the CAM array and its internal comparand bus CBUS. In such applications, multiple load operations are required to load a comparand word into a CAM array for compare operations. For example, if an external 32-bit bus is used to provide 128-bit comparand words to a 128-bit wide CAM array, four 32-bit load operations are required to load the 128-bit comparand word into the CAM array. In contrast to prior art CAM architectures, which typically wait until all four load operations are complete before beginning the compare operation, present embodiments may improve performance by overlapping load and compare operations. For example, after a first 32-bit segment of a comparand word is loaded, compare operations may begin on the first 32-bit segment while a second 32-bit segment is loaded. Match conditions within the second 32-bit segment of row 60 may then be evaluated while the third 32-bit segment of the comparand word is loaded, and so on. Accordingly, by executing load and compare operations for such applications in a pipelined fashion, present embodiments may not only reduce power consumption but also achieve performance advantages over prior art structures.

Figure 7:
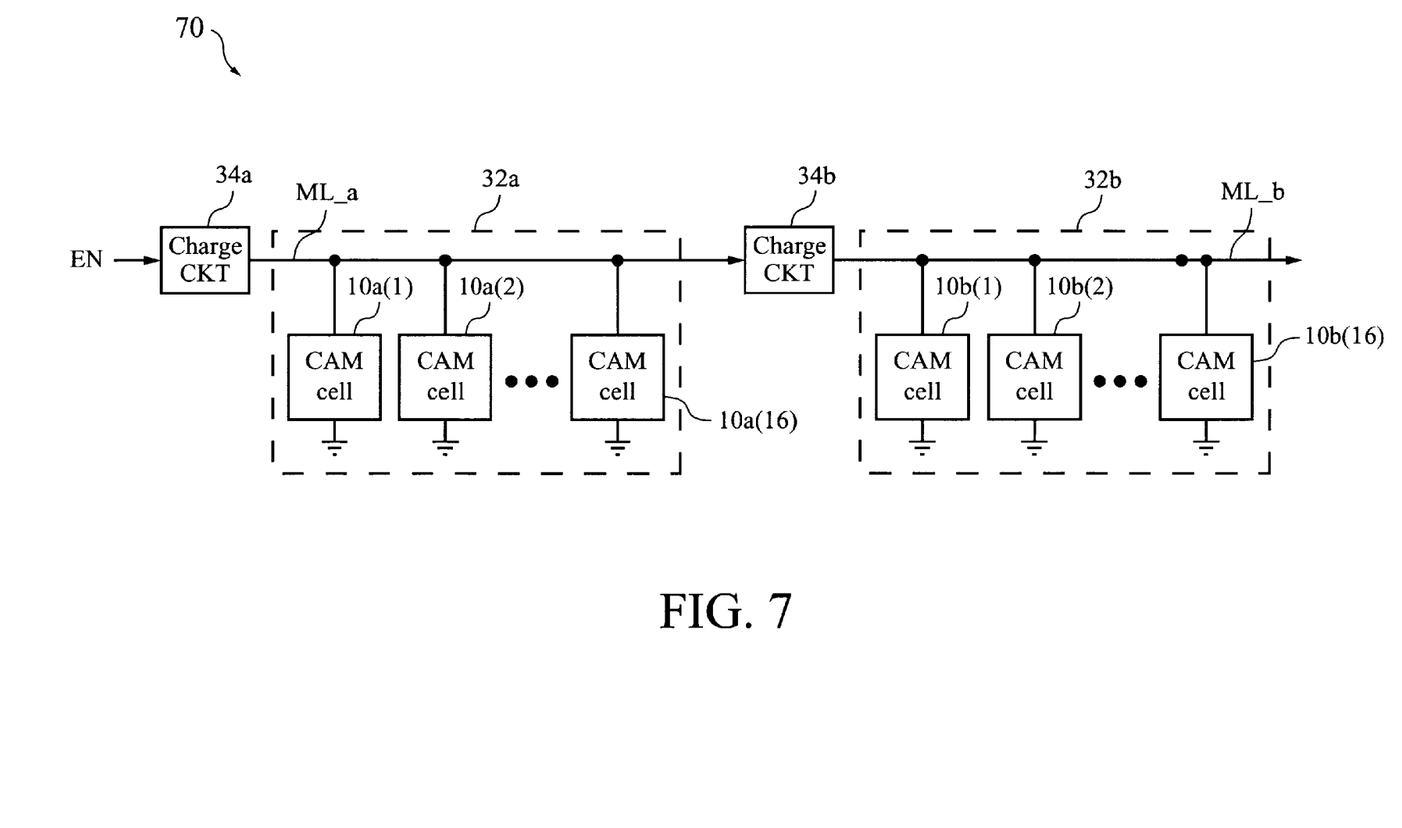
FIG. 7 is a block diagram of another embodiment of a row of the CAM architecture of FIG. 2.

FIG. 7. shows a row 70 in accordance with still another embodiment of the present invention which provides sequential, asynchronous compare operations. Here, pre-charge signals PCH(1)–PCH(n) are omitted to provide an asynchronous CAM structure. Enable signal EN, which as mentioned above may be provided by instruction decoder 22, is provided directly to charge circuit 34a to pre-charge match line segment ML_a of first row segment 32a. Match line segment ML_a is connected to second charge circuit 34b. Thus, second match line segment ML_b is pre-charged to enable detection of match conditions within second row segment 32b only in response to the logic state of first match line match segment ML_a.

Figure 8:
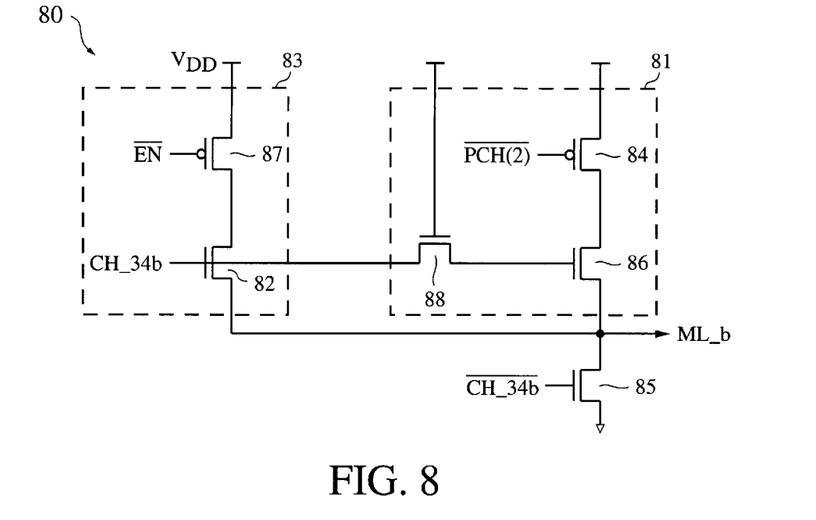
FIG. 8 is a circuit diagram of the charge circuit of FIG. 1 in accordance with one embodiment.

FIG. 8 shows a charge circuit 80 that is one embodiment of the charge circuit 34b of FIG. 3. Other embodiments may be used. Charge circuit 80 includes an AC pre-charge circuit 81, a DC pre-charge circuit 83, and a discharge transistor 85. DC pre-charge circuit 83 is a weak pre-charge circuit that maintains the pre-charge logic state on ML_b when the relatively strong AC pre-charge circuit 81 has completed its pre-charge operation (i.e., when PCH(2) is de-asserted). DC pre-charge circuit 83 includes transistors 82 and 87 coupled in series between $V_{DD}$ and ML_b. Transistors 82 and 87 pre-charge ML_b so long as a compare instruction is being performed (i.e., EN logic high), and match detect logic 36 indicates that there is a match condition for a previous row segment (i.e., by asserting CH_34b logic high). Weak PMOS transistor 87 has its gate coupled to $\overline{EN}$, and weak NMOS transistor 82 has its gate coupled to CH_34b. For alternative embodiments, DC pre-charge 83 may be omitted.

AC pre-charge circuit 81 includes transistors 84, 86, and 88, and pre-charges ML_b when the pre-charge signal PCH(2) is asserted. PMOS transistor 84 and NMOS transistor 86 serve as strong pull-up transistors and are connected in series between match line segment ML_b and $V_{DD}$. PMOS transistor 84 has its gate coupled to $\overline{PCH(2)}$. NMOS pass transistor 88 has its gate tied to $V_{DD}$, and passes CH_34b to the gate of NMOS transistor 86. NMOS transistor 88 is optional, and buffers signal CH_34b from the gate of transistor 86. When $\overline{PCH(2)}$ is logic low (PCH(2) logic high) and CH_34b is logic high, transistors 84 and 86 turn on and rapidly charge match line segment ML_b toward $V_{DD}$.

Discharge transistor 85 is included to discharge ML_b when the preceding row segment indicates a mismatch condition or has not yet resolved its match condition. Discharge transistor 85 is an NMOS transistor that has its drain coupled to ML_b, its gate coupled to $\overline{CH\_34b}$, and its source coupled to ground. Other discharge circuits can be used.

When pre-charge circuit 80 is used as charge circuit 34a, the gate of transistor 82 may receive EN, and the gate of discharge transistor 85 may have its gate coupled to $\overline{EN}$.

It is noted that sequential pre-charging of match line segments in response to match conditions evaluated in preceding row segments, as described above with respect to the present invention, does not adversely affect latency delay during compare operations. Conversely, since match line loading is effectively reduced by dividing the match lines into a plurality of segments, thereby reducing RC delays, present embodiments may improve speed during compare operations.

Figure 9:
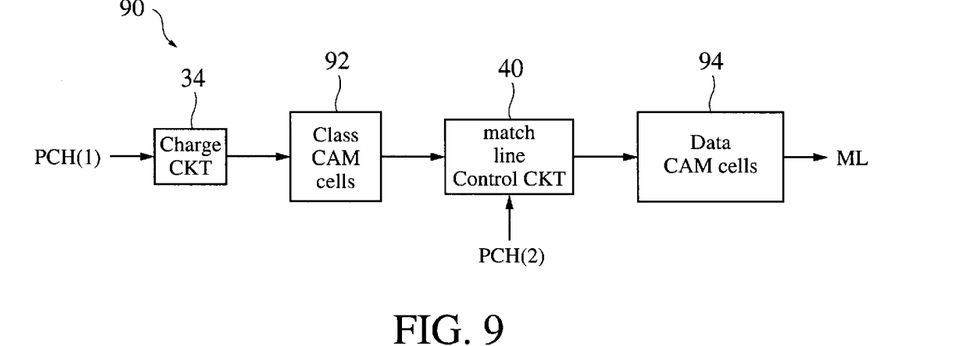
FIG. 9 is a block diagram of a CAM architecture storing class data in one row segment and storing corresponding data in a second row segment in accordance with one embodiment of the present invention.

Sequential search techniques in accordance with present embodiments may be used to implement a class searching function useful, for example, in Internet routing applications. For example, FIG. 9 shows a CAM row 90 that is one embodiment of CAM 20 of FIG. 2 configured to implement a class searching function. Row 90 includes a first row segment 92 having a first number of CAM cells designated as class cells, and a second row segment 94 having a second number of CAM cells designated as data cells. In one embodiment, the class and data cells of FIG. 9 are of the type shown in FIG. 1, although in other embodiments other suitable CAM cells may be used, including ternary CAM cells. Data cells in data segment 94 store data such as Internet addresses, while class cells in class segment 92 store class information which indicates to which class corresponding data belongs. A comparand word containing class and data segments aligned with class and data segments 92 and 94, respectively, is provided to the CAM rows 90 during a compare operation. Match line segments (not shown for simplicity) in class segment 92 are pre-charged toward $V_{DD}$ by charge circuit 34 in response to pre-charge signal PCH(1) in the manner described above with respect to FIGS. 3 and 4.

During compare operations, if class information stored in class segment 92 matches the class segment of the comparand word, match line segments in corresponding data segment 94 are pre-charged toward $V_{DD}$ to enable detection of match conditions in data segment 94. If, on the other hand, there is a mismatch condition in class segment 92, match lines within corresponding data segment 94 are not pre-charged to force a mismatch condition for the row. In this manner, data stored in data cells of data segment 94 may be initially be searched according to class and, if there is a match, then searched according to data. Accordingly, the selective pre-charging of match line segments in data segment 94 not only reduces power consumption during compare operations, but also allows for sequential searching based upon a plurality of pre-defined classes. In this manner, present embodiments may implement a dynamic masking function based upon class matches, e.g., match conditions in preceding row segments.

In one embodiment, class segment 92 of row 90 includes 4 CAM cells, thereby allowing for $2^4=16$ different classes or applications, and data segment 94 includes 32 or 128 CAM cells. For example, data segment 94 may store a 32-bit or 128-bit Internet Protocol (IP) address, while class segment 92 indicates to which of 16 classes the corresponding IP address belongs. The classes may indicate suitable information about the corresponding address such as, for instance, a virtual private network (VPN) identifier or an identifier for protocol-based applications. Here, for example, embodiments of FIG. 9 allow for address entries stored within data segment 94 to be first searched for a class match, and then subsequently searched for an address match. Comparison may be performed in a single clock cycle or in multiple clock cycles. Further, since in this example the match line segments corresponding to only 4 of the CAM cells in row are initially pre-charged for compare operations, and thus the match line segment(s) corresponding to the remaining 32 or 128 CAM cells in row 90 are not pre-charged, power consumption associated with match line pre-charging may be significantly reduced over prior art structures.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, CAMs in accordance with present embodiments may include any suitable number of row segments each of having any suitable number of cells.

We claim:

1. A content addressable memory (CAM) including a plurality of rows, each of the rows comprising:

a first row segment having a first number of CAM cells coupled to a first match line segment;

a second row segment having a second number of CAM cells coupled to a second match line segment; and a charge circuit coupled to the first and second match line segments to selectively pre-charge the second match line segment in response to match conditions in the first row segment.

2. The CAM of claim 1, wherein the first number of CAM cells equals the second number of CAM cells.

3. The CAM of claim 1, wherein the first number of CAM cells comprise class cells and the second number of CAM cells comprise data cells.

4. The CAM of claim 1, wherein the charge circuit is operable to discharge the second match line segment in response to a mismatch condition in the first row segment.

5. The CAM of claim 1, further comprising match detect logic coupled to the first match line segment and the charge circuit.

6. The CAM of claim 5, wherein the match detect logic comprises a latch.

7. The CAM of claim 5, wherein the match detect logic comprises an AND gate.

8. The CAM of claim 6, wherein the charge circuit includes an input terminal coupled to receive a pre-charge signal.

9. The CAM of claim 8, wherein the pre-charge signal comprises a clock signal.

10. The CAM of claim 8, wherein the pre-charge signal is provided by an instruction decoder.

11. The CAM of claim 5, wherein the charge circuit comprises a pull-up transistor coupled between the second match line segment and a supply voltage and having a gate responsive to match conditions in the first row segment.

12. The CAM of claim 11, wherein the charge circuit further comprises a pass transistor coupled between the match detect logic and the gate of the pull-up transistor.

13. The CAM of claim 11, wherein the charge circuit further comprises a second pull-up transistor coupled in series with the first pull-up transistor and the supply voltage and having a gate coupled to receive a pre-charge signal.

14. The CAM of claim 13, wherein the charge circuit further comprises a discharge transistor coupled between the second match line segment and ground potential.

15. A content addressable memory (CAM) including a plurality of rows, each of the rows comprising:

a first composite row segment including a plurality of first row segments each having a number of CAM cells coupled to a corresponding one of a plurality of first match line segments;

a second composite row segment including a plurality of second row segments each having a number of CAM cells coupled to a corresponding one of a plurality of second line segments; and a match line control circuit having a plurality of input terminals coupled to the plurality of first match line segments and having an output terminal coupled to each of the plurality of second match line segments.

16. The CAM of claim 15, wherein the match line control circuit selectively charges the match line segments of the second composite row segment in response to match conditions in the first composite row segment.

17. The CAM of claim 15, wherein the match line control circuit comprises match detect logic.

18. The CAM of claim 17, wherein the match detect logic comprises an AND gate.

19. The CAM of claim 17, wherein the match line control circuit further comprises a charge circuit.

20. The CAM of claim 19, wherein the charge circuit comprises a pull-up transistor responsive to match conditions in the first composite row segment.

21. A method for selectively enabling a plurality of row segments within a row of a content addressable memory (CAM) array, each row segment including a number of CAM cells, the method comprising:

evaluating match conditions in a first row segment; and selectively pre-charging a second match line segment corresponding to a second row segment to enable detection of match conditions therein in response to the match conditions in the first row segment.

22. The method of claim 21, wherein evaluating match conditions in the first row segment comprises determining the logic state of a first match line segment.

23. The method of claim 22, further comprising pre-charging the first match line segment to enable detection of match conditions in the first row segment.

24. The method of claim 21, further comprising maintaining the second match line segment in a discharged state if there is a mismatch condition in the first row segment.

25. The method of claim 21, further comprising classifying the CAM cells the first row segment as class cells and classifying the CAM cells in the second row segment as data cells.

26. A content addressable memory (CAM) including a plurality of rows, each of the rows comprising:

a first row segment having a first number of CAM cells coupled to a first match line segment;

a second row segment having a second number of CAM cells coupled to a second match line segment; and means for pre-charging the second match line segment in response to match conditions in the first row segment.

27. The CAM of claim 26, wherein the means for pre-charging comprises a charge circuit having an input terminal coupled to the first match line segment and an output terminal coupled to the second match line segment.

28. The CAM of claim 27, wherein the means for pre-charging further comprises match detect logic having a first input terminal coupled to the first match line segment and an output terminal coupled to the input terminal of the charge circuit.

29. The CAM of claim 27, wherein the charge circuit comprises a pull-up transistor coupled between the second match line segment and a supply voltage.

30. The CAM of claim 27, wherein the match detect logic comprises a latch.

31. A content addressable memory (CAM) including a plurality of rows, each of the rows comprising:

a first row segment having a first number of CAM cells coupled to a first match line segment;

a second row segment having a second number of CAM cells coupled to a second match line segment; and a match line control circuit coupled to the first and second match line segments, comprising:

a latch having an input terminal coupled to the first match line segment and having an output terminal; and a charge circuit having an input terminal coupled to the output terminal of the latch and an output terminal coupled to the second match line segment.

32. A content addressable memory (CAM) including a plurality of rows, each of the rows comprising:

a first row segment having a first number of CAM cells coupled to a first match line segment;

a second row segment having a second number of CAM cells coupled to a second match line segment; and a match line control circuit coupled to the first and second match line segments, comprising:

match detect logic having an input terminal coupled to the first match line segment and having an output terminal; and a charge circuit having a first input terminal coupled to the output terminal of the match detect logic, a second input terminal coupled to receive a pre-charge signal, and an output terminal coupled to the second match line segment.

33. The CAM of claim 32, wherein the pre-charge signal comprises a clock signal.

34. The CAM of claim 32, wherein the pre-charge signal is provided by an instruction decoder.

35. A content addressable memory (CAM) including a plurality of rows, each of the rows comprising:

a first row segment having a first number of CAM cells coupled to a first match line segment;

a second row segment having a second number of CAM cells coupled to a second match line segment; and a match line control circuit coupled to the first and second match line segments, comprising:

match detect logic coupled to the first match line segment; and a charge circuit coupled between the match detect logic and the second match line segment, the charge circuit comprising a pull-up transistor coupled between the second match line segment and a supply voltage and having a gate responsive to match conditions in the first row segment.

36. The CAM of claim 35, wherein the charge circuit further comprises a pass transistor coupled between the match detect logic and the gate of the pull-up transistor.

37. The CAM of claim 35, wherein the charge circuit further comprises a second pull-up transistor coupled in series with the first pull-up transistor and the supply voltage and having a gate coupled to receive a pre-charge signal.

38. The CAM of claim 37, wherein the charge circuit further comprises a discharge transistor coupled between the second match line segment and ground potential.

39. The CAM of claim 17, wherein the match detect logic comprises a latch.

40. The CAM of claim 16, wherein the match line control circuit is operable to discharge the second match line segment in response to a mismatch condition in the first row segment.

* * * * *